US011967655B2

(12) United States Patent
Rim et al.

(10) Patent No.: US 11,967,655 B2
(45) Date of Patent: Apr. 23, 2024

(54) BUILT-IN BYPASS DIODE (71) Applicant: Maxeon Solar Pte. Ltd., Singapore (SG)

(72) Inventors: Seung Bum Rim, Palo Alto, CA (US); David D. Smith, Campbell, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 16 days.

(21) Appl. No.: 16/918,218

(22) Filed: Jul. 1, 2020

(65) Prior Publication Data

US 2020/0335642 A1 Oct. 22, 2020

Related U.S. Application Data (63) Continuation of application No. 14/136,719, filed on Dec. 20, 2013, now abandoned.

(51) Int. Cl.
| | |
|---|---|
| H01L 31/0216 | (2014.01) |
| H01L 27/142 | (2014.01) |
| H01L 31/0224 | (2006.01) |
| H01L 31/0443 | (2014.01) |
| H01L 31/0745 | (2012.01) |

(52) U.S. Cl.
CPC .... *H01L 31/02167* (2013.01); *H01L 27/1421* (2013.01); *H01L 31/022441* (2013.01); *H01L 31/0443* (2014.12); *H01L 31/0745* (2013.01); Y02E 10/50 (2013.01)

(58) Field of Classification Search
CPC .................................................. Y02E 10/50
See application file for complete search history.

(56) References Cited

U.S. PATENT DOCUMENTS

| | | | |
|---|---|---|---|
| 8,604,330 B1* | 12/2013 | Hennessy | ........... H01L 27/1421 136/201 |
| 2002/0007846 A1 | 1/2002 | Kawano | |
| 2003/0213974 A1 | 11/2003 | Armstrong et al. | |
| 2007/0256728 A1* | 11/2007 | Cousins | ................ H01L 31/068 136/252 |
| 2008/0173347 A1 | 7/2008 | Korevaar et al. | |
| 2008/0308143 A1 | 12/2008 | Atanackovic | |
| 2009/0308438 A1 | 12/2009 | De Ceuster et al. | |

(Continued)

FOREIGN PATENT DOCUMENTS

| | | |
|---|---|---|
| CN | 203339177 | 12/2013 |
| JP | 2003/505862 | 2/2003 |

(Continued)

OTHER PUBLICATIONS

Preliminary Official Action from Brazilian Patent Application No. 112016011872-3 dated Aug. 13, 2020, 6 pgs.

(Continued)

*Primary Examiner* — Dustin Q Dam
(74) *Attorney, Agent, or Firm* — Schwabe, Williamson & Wyatt, P.C.

(57) ABSTRACT

A bypass diode can include a first conductive region of a first conductivity type disposed above a substrate of a solar cell and a second conductive region of a second conductivity type disposed above the first conductive region. The bypass diode can include a thin dielectric region disposed directly between the first and second conductive regions.

15 Claims, 9 Drawing Sheets

(56) References Cited

U.S. PATENT DOCUMENTS

| | | | |
|---|---|---|---|
| 2010/0108119 | A1 | 5/2010 | Gee et al. |
| 2011/0023956 | A1* | 2/2011 | Harder ............ H01L 31/022441 |
| | | | 136/256 |
| 2011/0114156 | A1 | 5/2011 | Coakley et al. |
| 2011/0284986 | A1* | 11/2011 | Rim ..................... H01L 29/861 |
| | | | 257/510 |
| 2012/0060890 | A1 | 3/2012 | Park et al. |
| 2013/0164878 | A1 | 6/2013 | Cousins et al. |
| 2013/0213469 | A1 | 8/2013 | Kramer et al. |
| 2014/0020752 | A1 | 1/2014 | Arimoto et al. |
| 2014/0026955 | A1* | 1/2014 | Nishimoto .......... H01L 31/0516 |
| | | | 136/256 |
| 2014/0102531 | A1 | 4/2014 | Moslehi |
| 2014/0199806 | A1* | 7/2014 | Lennon ................ H01L 31/056 |
| | | | 438/98 |
| 2015/0048497 | A1 | 2/2015 | Henderson et al. |

FOREIGN PATENT DOCUMENTS

| | | |
|---|---|---|
| JP | 2009/535845 | 10/2009 |
| JP | 2011/523230 | 8/2011 |
| TW | 2012/46583 | 11/2012 |
| WO | WO 0106565 | 1/2001 |
| WO | WO 2009/151808 | 12/2009 |
| WO | WO 2011/149021 | 12/2011 |
| WO | WO 2013/058724 | 4/2013 |
| WO | WO 2013/069492 | 5/2013 |

OTHER PUBLICATIONS

International Search Report and Written Opinion for PCT Patent Application No. PCT/US2014/070164 dated Mar. 30, 2015, 11 pgs.
International Preliminary Report on Patentability for PCT Patent Application No. PCT/US2014/070164 dated Jun. 30, 2016, 7 pgs.
Extended European Search Report for European Patent Application No. 14872115.2 dated Nov. 17, 2016, 6 pgs.
Written Opinion for Singapore Patent Application No. 11201605042W dated May 25, 2017, 8 pgs.
First Office Action from Chinese Patent Application No. 2014800698967 dated Jun. 16, 2017, 2 pgs.
Second Office Action from Chilean Patent Application No. 01521-2016 dated Dec. 12, 2017.
Non-Final Office Action from Japanese Patent Application No. 2016-519958 dated Feb. 14, 2018, 4 pgs.
First Official Action for Mexican Appl. No. MX/a/2016/007331 dated Jul. 6, 2018, 5 pgs.
First Office Action for Taiwan Patent Application No. 103144666 dated Aug. 1, 2018, 4 pgs.
Final Office Action for Japanese Patent Application No. 2016-519958 dated Aug. 28, 2018, 6 pgs.
First Examination Report from Australian Patent Application No. 201466257 dated Oct. 30, 2018, 3 pgs.
Non-Final Notice of Reasons for Rejection for Japanese Application No. 2016-519958 dated Feb. 5, 2019, 3 pgs.
Office Action from Malaysian Patent Application No. PI 2016000676 dated May 6, 2020, 3 pgs.
First Examination Report from Saudi Arabia Patent Application No. 516371366 dated May 11, 2020, 7 pgs.
$2^{nd}$ Examination Report from PCT National Phase Application No. 516371366 dated Sep. 20, 2020, 6 pgs.
First Action Interview Pilot Program Pre-Interview Communication from U.S. Appl. No. 14/136,719 dated May 18, 2016, 5 pgs.
First Action Interview Office Action from U.S. Appl. No. 14/136,719 dated Jan. 30, 2017, 19 pgs.
Final Office Action from U.S. Appl. No. 14/136,719 dated Jul. 11, 2017, 25 pgs.
Non-Final Office Action from U.S. Appl. No. 14/136,719 dated Mar. 8, 2018, 30 pgs.
Final Office Action from U.S. Appl. No. 14/136,719 dated Jun. 27, 2018, 32 pgs.
Non-Final Office Action from U.S. Appl. No. 14/136,719 dated Dec. 14, 2018, 35 pgs.
Final Office Action from U.S. Appl. No. 14/136,719 dated Jun. 19, 2019, 26 pgs.
Non-Final Office Action from U.S. Appl. No. 14/136,719 dated Jan. 9, 2020, 29 pgs.
Office Action from Philippines Patent Application No. 1-2016-501140 dated Feb. 28, 2022, 5 pgs.

\* cited by examiner

BUILT-IN BYPASS DIODE

CROSS-REFERENCE TO RELATED APPLICATIONS

This application is a continuation of U.S. patent application Ser. No. 14/136,719, filed on Dec. 20, 2013, the entire contents of which are hereby incorporated by reference herein.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

DETAILED DESCRIPTION

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology

The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" conductive region of a solar cell does not necessarily imply that this conductive region is the first conductive region in a sequence; instead the term "first" is used to differentiate this conductive region from another conductive region (e.g., a "second" conductive region).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Although many of the examples described herein are back contact solar cells, the techniques and structures apply equally to other (e.g., front contact) solar cells as well. Moreover, although much of the disclosure is described in terms of solar cells for ease of understanding, the disclosed techniques and structures apply equally to other semiconductor structures.

Bypass diodes for solar cells and methods of forming solar cell bypass diodes are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Solar cells are typically heated when reversely biased by shading and/or soiling. Bypass diodes can be used to protect solar cells from breakdown during such events. However, power can be lost because bypass diodes are typically attached on a per-string basis (e.g., 12-18 cells) and the protection is not perfect if hot spots are present. Thus, the disclosed bypass diodes can provide bypass diode protection at the individual solar cell level. The protection can be for reverse bias events as well as for temperature suppression of hot spots.

Figure 1:
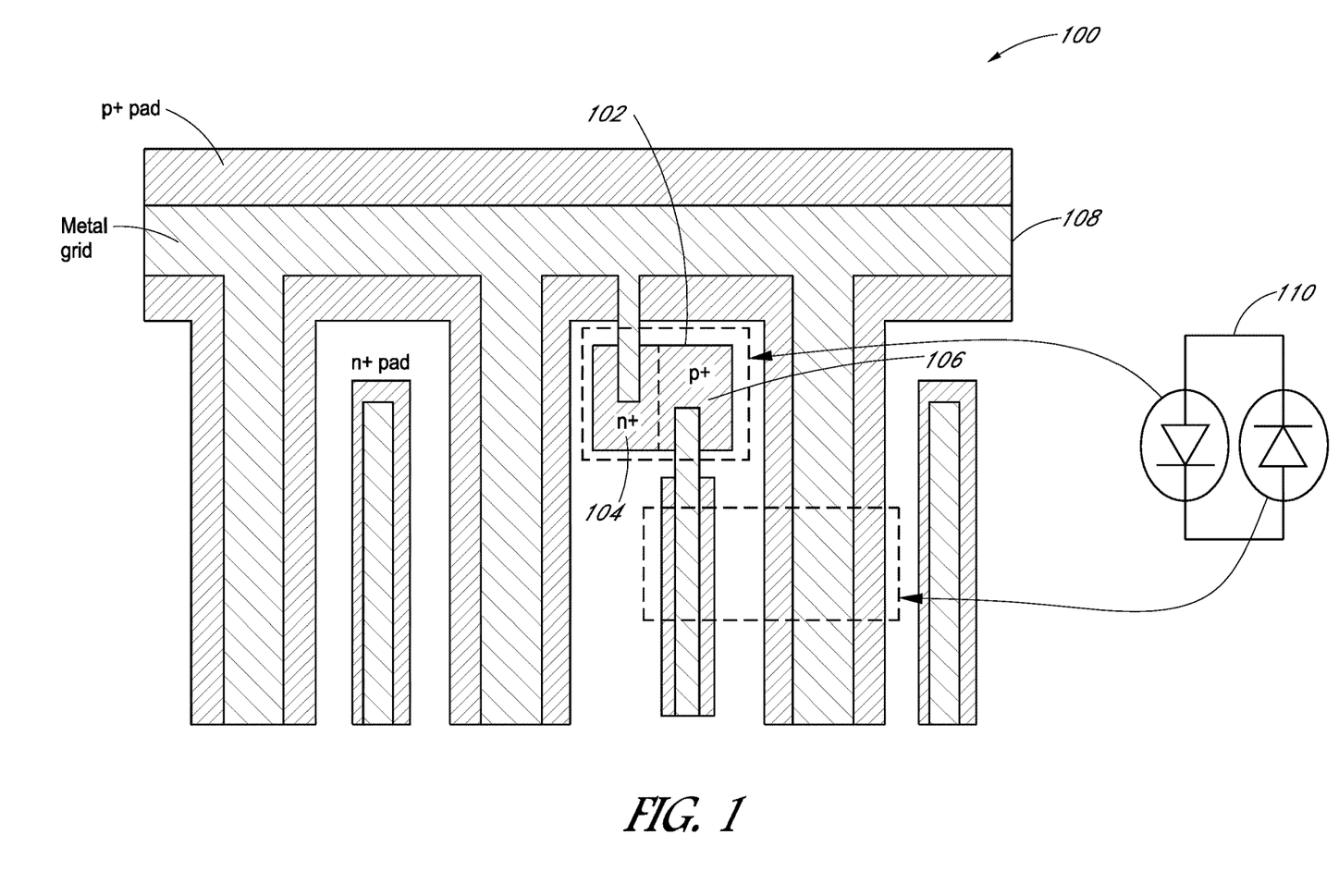
FIG. 1 illustrates a top-down plan view of a bypass diode for a solar cell, according to some embodiments.

Turning now to FIG. 1, a top-down plan view of an example bypass diode for a solar cell is shown. Portion 100 of a solar cell can include polysilicon bypass diode 102 with N+ region 104 and P+ region 106. As shown, metal grid 108 can make contact to region 104. As depicted by diode schematic 110, bypass diode 102 is shunted to its corresponding solar cell.

In one embodiment and as described herein, P+ polysilicon is at the bottom of bypass diode 102 and is isolated from other P fingers. In various embodiments, the area consumed by bypass diode 102 cannot be used for power generation and is thus fabricated to be small relative to the total area of the solar cell. Note that a single solar cell can include multiple bypass diodes and is not limited to a single built-in bypass diode. In one embodiment, bypass diode 102 can provide higher current in reverse bias to reduce power consumption.

Figure 2:
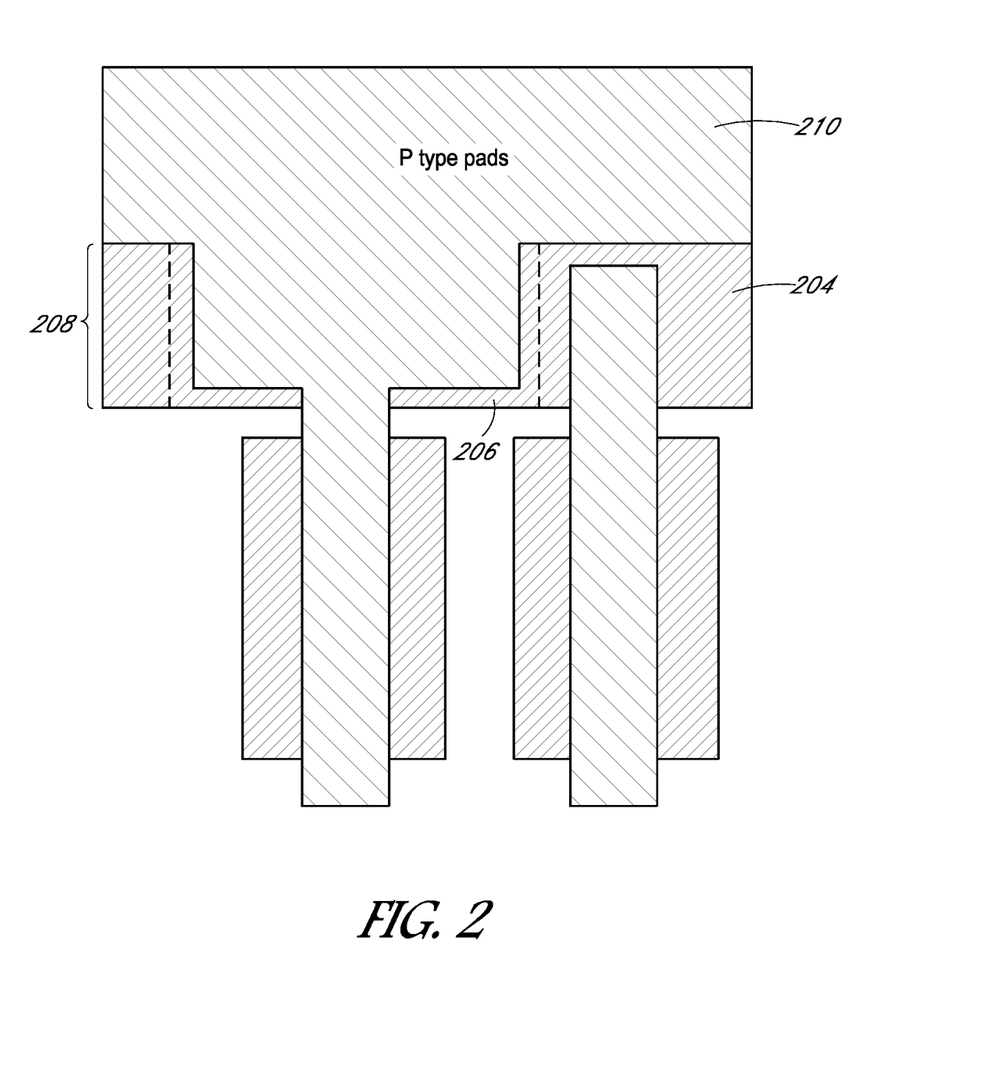
FIG. 2 illustrates a top-down plan view of a bypass diode including P-type and N-type regions, according to some embodiments.

Turning to FIG. 2, a top-down plan view of one embodiment of a bypass diode including P-type and N-type conductive regions is illustrated. As shown, N-type polysilicon 206 can be contacted with P-type pad 210. Contact is also made to the P-type portion of polysilicon diode 208 to provide interconnection of built-in bypass diode 208 shunted to solar cells. The spatial area of such a bypass diode can be adjusted depending on the amount of current protected, and/or depending on a selected sacrifice in forward bias.

Figure 3:
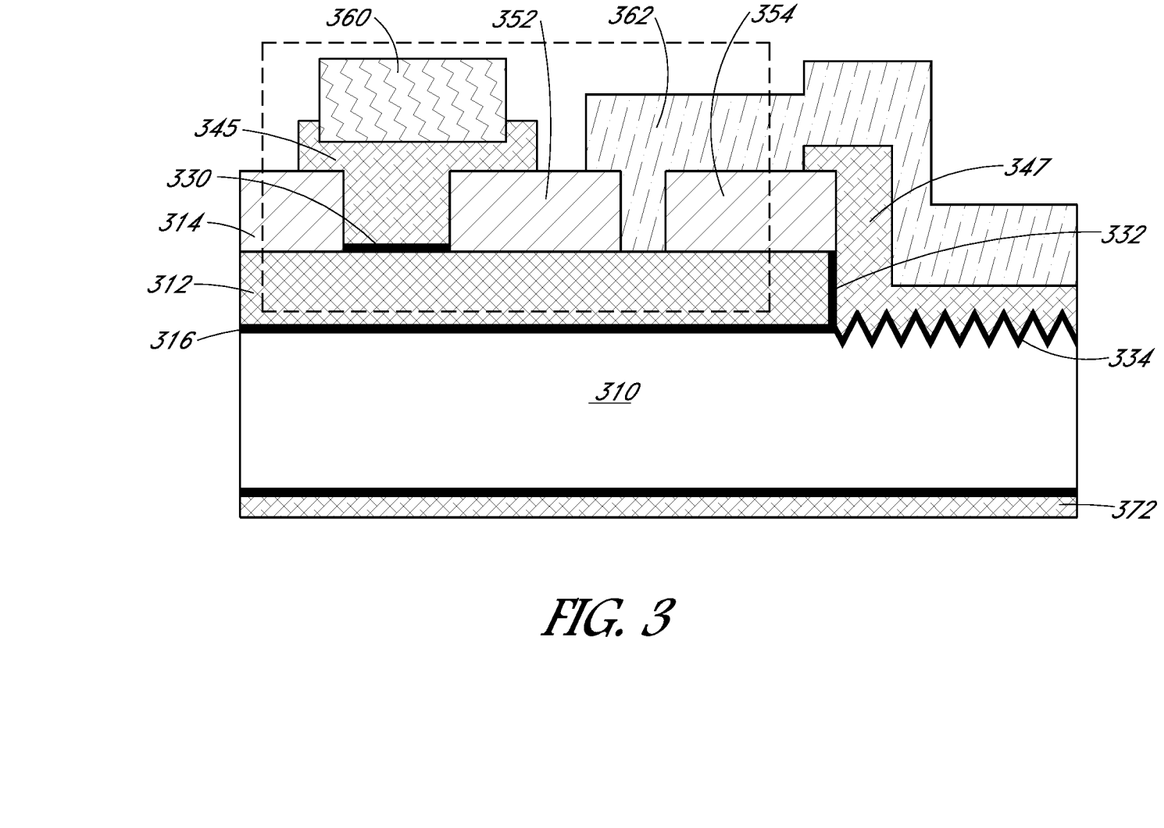
FIG. 3 illustrates a cross-section view of a bypass diode, according to some embodiments.

Turning now to FIG. 3, a cross-section view of one embodiment of a bypass diode is shown. As illustrated, bypass diode 302 can include first conductive region 312 of a first conductivity type disposed above substrate 310 of a solar cell. In one embodiment, the first conductivity type is P-type such that first conductive region 312 is P-type doped polysilicon. In other embodiments, the first conductivity type can be N-type doped polysilicon. In an embodiment in which the first conductivity type is P-type, the substrate can be doped with N-type dopant impurity atoms whereas in an embodiment in which the first conductivity type is N-type, the substrate can be doped with P-type dopant impurity atoms. In one embodiment, first conductive region 312 can be disposed on a thin dielectric layer, such as thin dielectric layer 316 disposed on the substrate.

In various embodiments, bypass diode 302 can include a second conductive region of a second conductivity type (opposite the first conductivity type) disposed above the first conductive region. As shown in FIG. 3, the second conduction region can be second conductive region 345. In embodiments in which the first conductivity type is P-type, the second conductivity is N-type. Similarly, in embodiments in which the first conductivity type is N-type, the second conductivity type is P-type.

In one embodiment, bypass diode 302 can include a metal of the first conductivity type 360 disposed on the second conductive region and a metal of the second conductivity type 362 disposed on the first conductive region. Note that a metal of the first conductivity type may be the same type of metal (e.g., aluminum, copper, silver, etc.) of the second conductivity type. The term metal of a particular (first, second, etc.) conductivity type is used herein to describe that the metal corresponds to fingers of a particular conductivity type. For example, metal that is used for the P fingers of a solar cell is referred to as P metal or P-type metal. Thus, in the bypass diode of FIG. 3, P-type metal is disposed on the N-type conductive region and N-type metal is disposed on the P-type conductive region. Note that in other portions of the solar cell that do not include a bypass diode, N-type metal contacts N-type conductive regions and P-type metal contacts P-type conductive regions to form the fingers of the solar cell.

As shown in FIG. 3, in some embodiments, the metal of the second conductivity type 362 can be disposed through an opening in a dielectric layer, as shown in the opening between dielectric regions 352 and 354. In one embodiment, dielectric regions 352, 354, and 314 can be an oxide layer, such as silicon dioxide. Also shown in FIG. 3, in some embodiments, second conductive region 345 can be disposed through an opening in a dielectric layer, such as the opening between dielectric regions 314 and 352.

In various embodiments, bypass diode includes a thin dielectric region disposed directly between the first and second conductive regions. The thin dielectric region disposed directly between the first and second conductive regions can have a thickness approximately in the range of 10-20 Angstroms. In one embodiment, the thin dielectric region is a tunnel oxide.

In one embodiment, the thin dielectric region, such as thin dielectric region 332 can be disposed laterally directly between the first conductive region 312 and second conductive region 347 without an isolation trench disposed in the substrate between the first and second conductive regions. Avoiding using an isolation trench disposed in the substrate between the first and second conductive regions can avoid having to metallize over the trench and therefore avoid shunting in manufacturing.

In one embodiment, the thin dielectric region, such as thin dielectric region 330, can be disposed directly above first conductive region 312 with the second conductive region 345 being disposed directly above thin dielectric region 330. In one embodiment, bypass diode 302 can include both thin dielectric regions 330 and 332.

Figure 4:
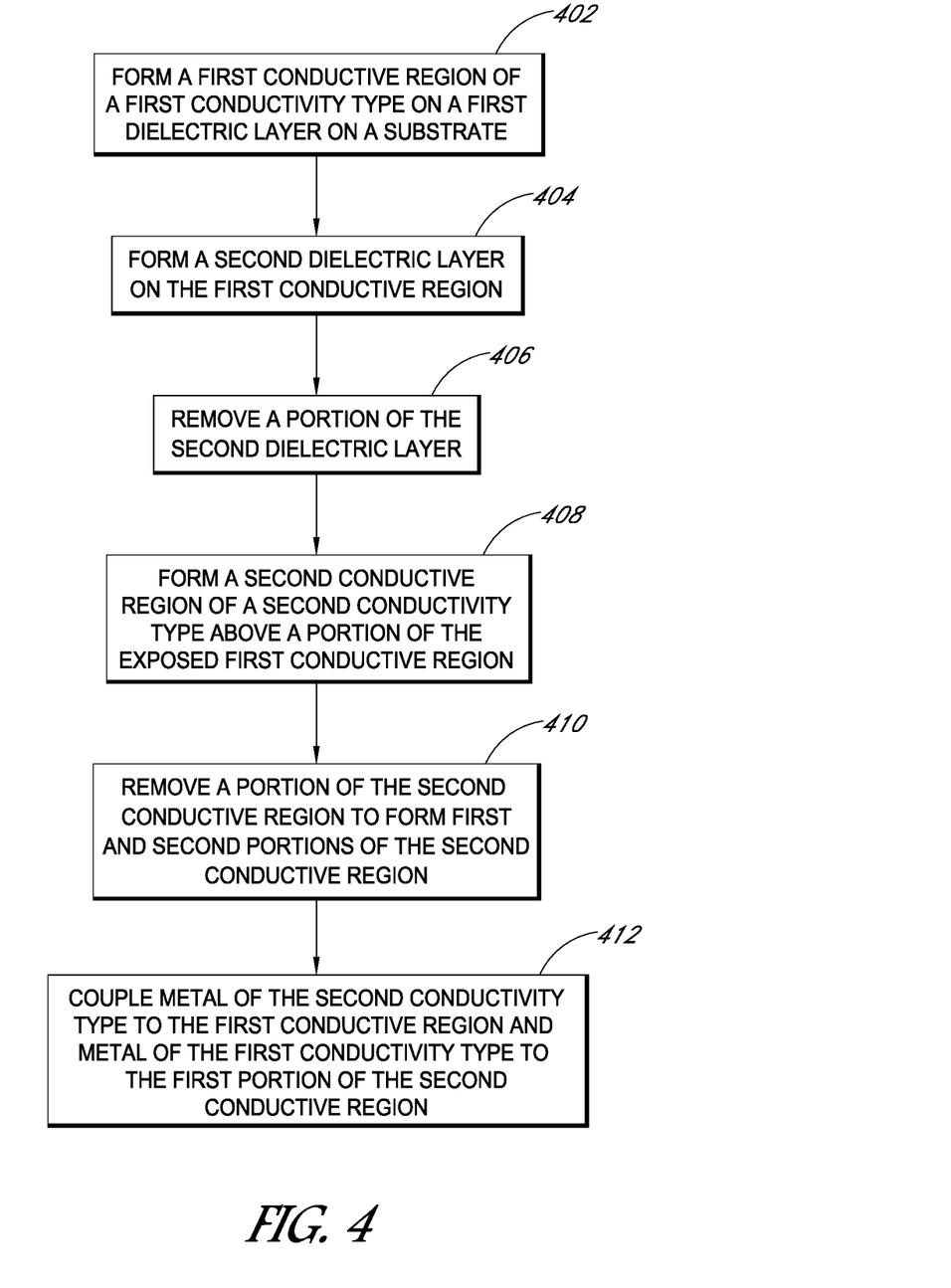
FIG. 4 is a flowchart illustrating an example method of forming a bypass diode, according to some embodiments.

Turning now to FIG. 4, a flow chart illustrating a method for forming a bypass diode is shown, according to some embodiments. In various embodiments, the method of FIG. 4 can include additional (or fewer) blocks than illustrated. The method of FIG. 4 is described in conjunction with cross-sectional sequential illustrations of various stages of the method shown at FIGS. 5-14. Note that some of the stages shown at FIGS. 5-14 are not necessarily part of the method for forming the bypass diode but are included for context.

Figures 5, 6:
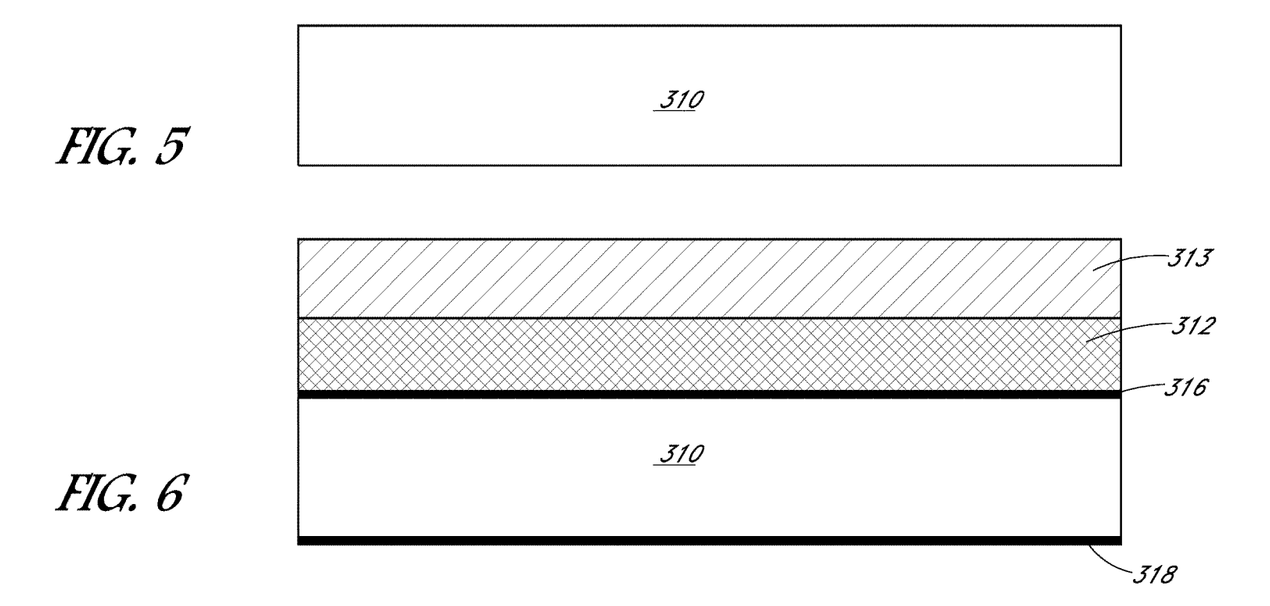
FIGS. 5-14 illustrate cross-sectional views of example sequences of forming a bypass diode, according to some embodiments.

At 402, a first conductive region of a first conductivity type can be formed on a first dielectric layer on a substrate of a solar cell, such as substrate 310 of FIG. 5. Forming a first conductive region can include forming a p-type conductive region. Forming the p-type conductive region can include forming a p-type polysilicon region (e.g., by doping polysilicon with p-type impurities) or can include forming an amorphous silicon region, which can then be formed into the p-type conductive region by performing a thermal process.

As illustrated at 404, a second dielectric layer can be formed on the first conductive region. In one embodiment, the second dielectric layer can be a silicon dioxide layer.

FIG. 6 illustrates an example result of blocks 402 and 404 with second dielectric layer 313 formed on first conductive region 312, which is formed on first dielectric layer 316 on substrate 310. Note that another dielectric layer 318 is illustrated in FIG. 6, which can be formed at the same time as first dielectric layer 316 or at a different time. In one embodiment, the other dielectric layer 318 is not formed at this stage of the method and instead, first dielectric layer 316 is formed without also forming other dielectric layer 318.

Figure 7:
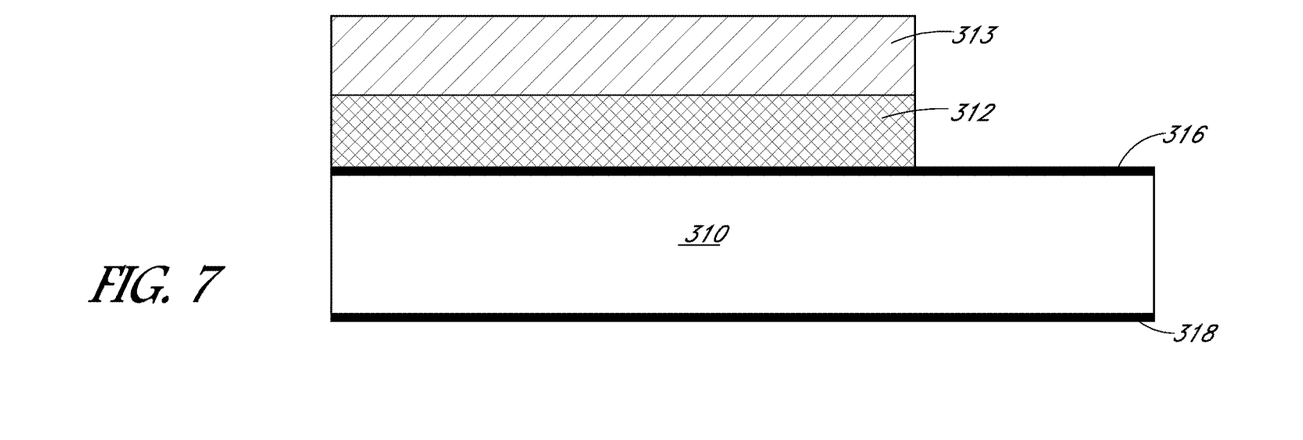

FIG. 7 illustrates a portion of the second dielectric layer 313 and first conductive region 312 being removed. Various techniques can be used to perform the removal, such as laser ablation or masking, then removing by etching the unmasked portion.

Figure 8:
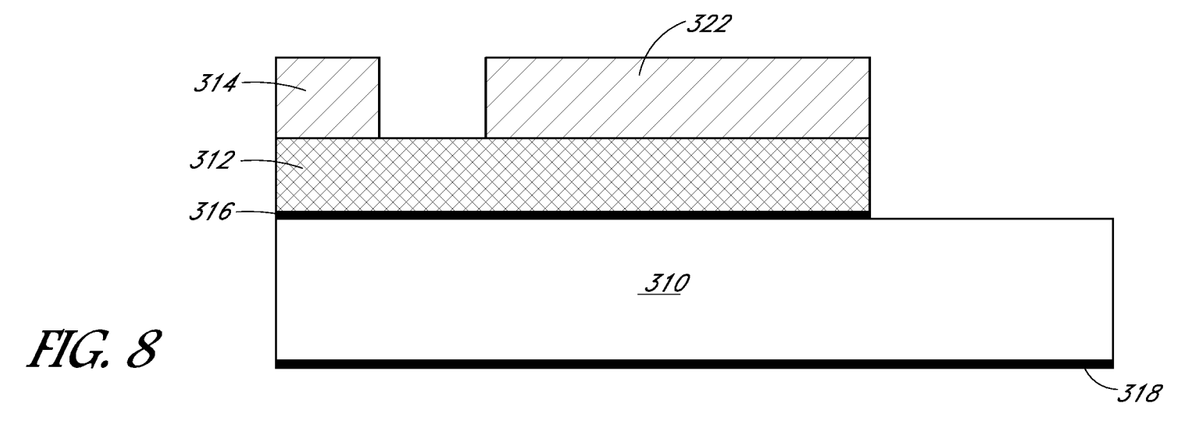

Turning back to FIG. 4, as shown at 406, a portion of the second dielectric layer can be removed and an opening in the second dielectric layer can be formed, as illustrated in FIG. 8 by the opening between remaining portions 314 and 322 of the second dielectric layer. In one embodiment, the portion of the second dielectric layer can be removed by laser ablation and in some embodiments, can be performed without also removing a portion (or removing a very shallow portion) of the first conductive region below the ablated portion. For example, the laser may be configured (e.g., power, shape, pulse duration, and/or wavelength, etc.) such that it is transparent to or has little or no effect on the first conductive region but ablates the second dielectric layer portion. In various embodiments in which the removal of materials shown in FIGS. 7 and 8 are both performed by laser ablation, the removals can be performed in the same tool but with different laser configurations or can be done with different lasers such that varying depths of ablation can be achieved as illustrated.

Figure 9:
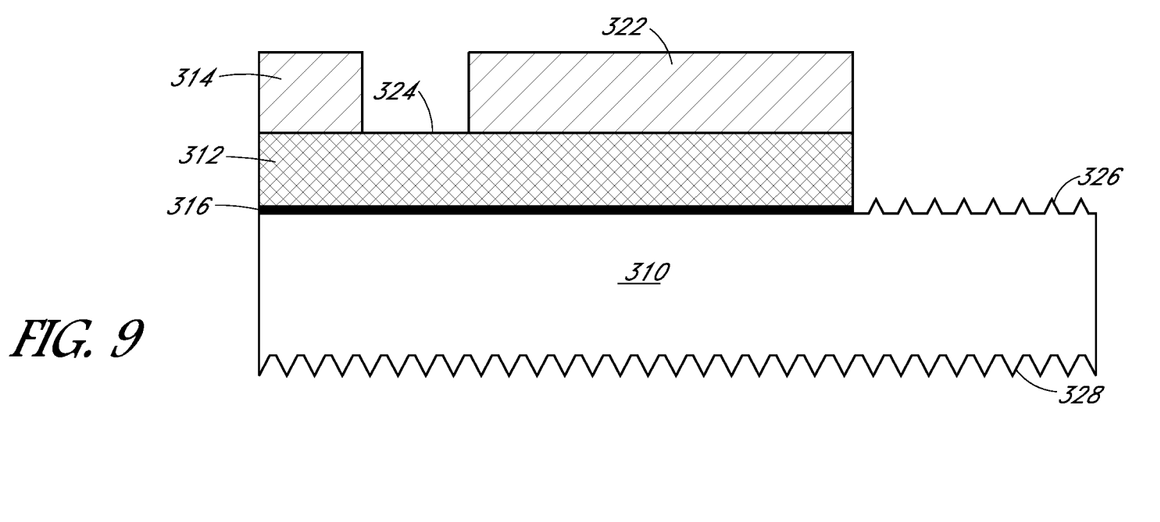

In one embodiment, regions of the solar cell can be texturized as shown at FIG. 9. FIG. 9 illustrates etching to texturize regions 326, 328, and 324. Note that texturized region 324 is textured less than regions 326 and 328 due to etch-resistant properties of p-poly.

Figure 11:
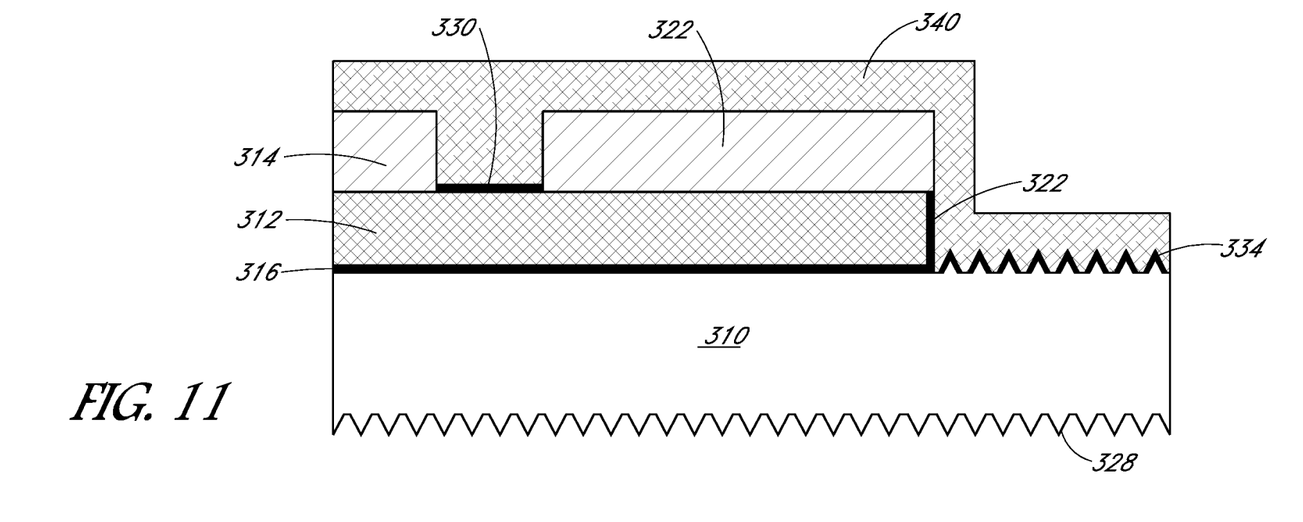

At 408, a second conductive region of a second conductivity type, as illustrated by second conduction region 340 of FIG. 11, can be formed above a portion of the exposed first conductive region (e.g., through the opening in the dielectric layer). In an embodiment in which the first conductivity type is p-type, forming the second conductive region can include forming an n-type conductive region. For example, forming the n-type conductive region can include forming an n-type polysilicon region (e.g., by doping polysilicon with n-type impurities) or can include forming an amorphous silicon region, which can then be formed into the n-type conductive region. In one embodiment, the formed second conductive region has an approximate thickness of 500 Angstroms.

In one embodiment, before forming the second conductive region at block 408, a third dielectric layer can be formed, which can provide separation between the first and second conductive regions. As described herein, the third dielectric layer can be a thin dielectric layer (e.g., 15 Angstroms, 10-20 Angstroms, etc.) and can isolate the first and second conductive regions without using a trench.

Figure 10:
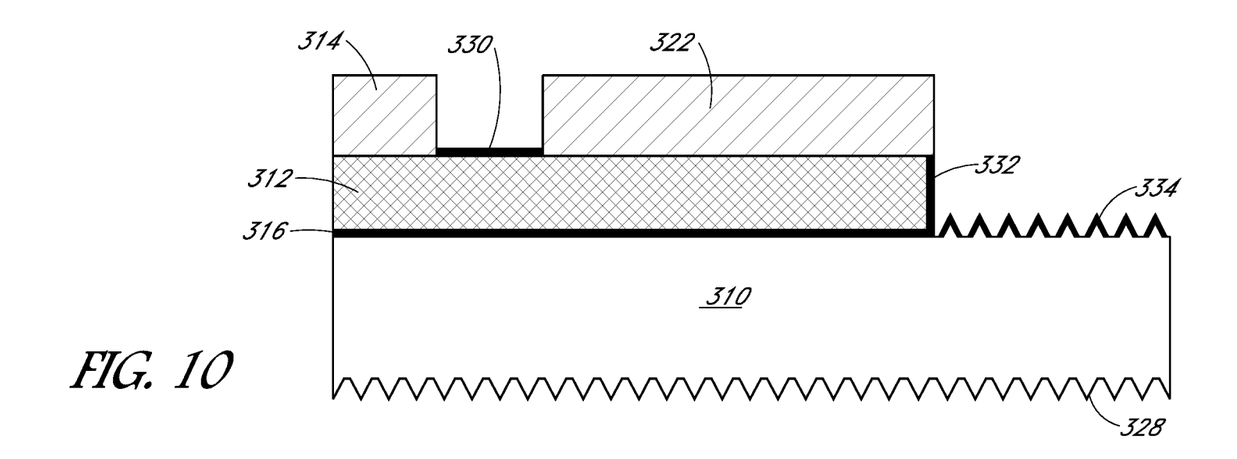

In one embodiment, the third dielectric layer can be formed such that it is disposed laterally between the first and second conductive regions (e.g., as shown by dielectric layer 332 in FIG. 10) and/or it can be formed such that it is disposed directly above the first conductive region (e.g., as shown by dielectric layer 330 in FIG. 10) with the second conductive region being disposed directly above the third dielectric layer (e.g., providing vertical separation). Note that a thin dielectric layer 334 can also be formed on the texturized portion of substrate 310, also as shown in FIG. 10. In various embodiments, depositing a tunnel oxide as the third dielectric layer can be conformal to the geometry of the back surface.

In various embodiments, the first dielectric layer can also be a thin dielectric layer, but may be a different thickness than the thin dielectric layer of the third dielectric layer. For example, the first dielectric layer can have a thickness approximately in the range of 5-50 Angstroms instead of the 10-20 Angstrom thickness of the third dielectric layer. The second dielectric layer can have a thickness approximately greater than 50 Angstroms.

Figure 12:
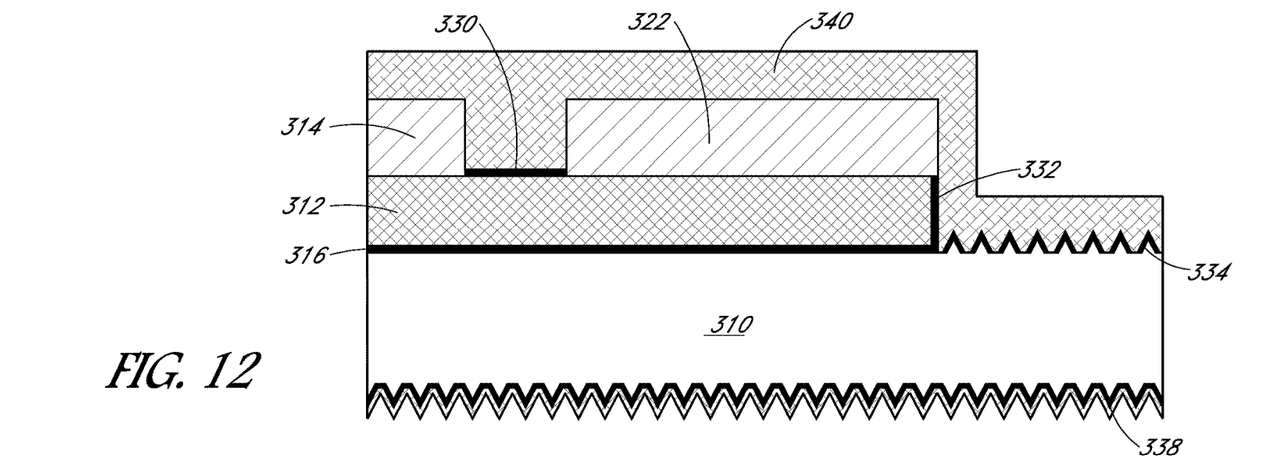
Figure 13:
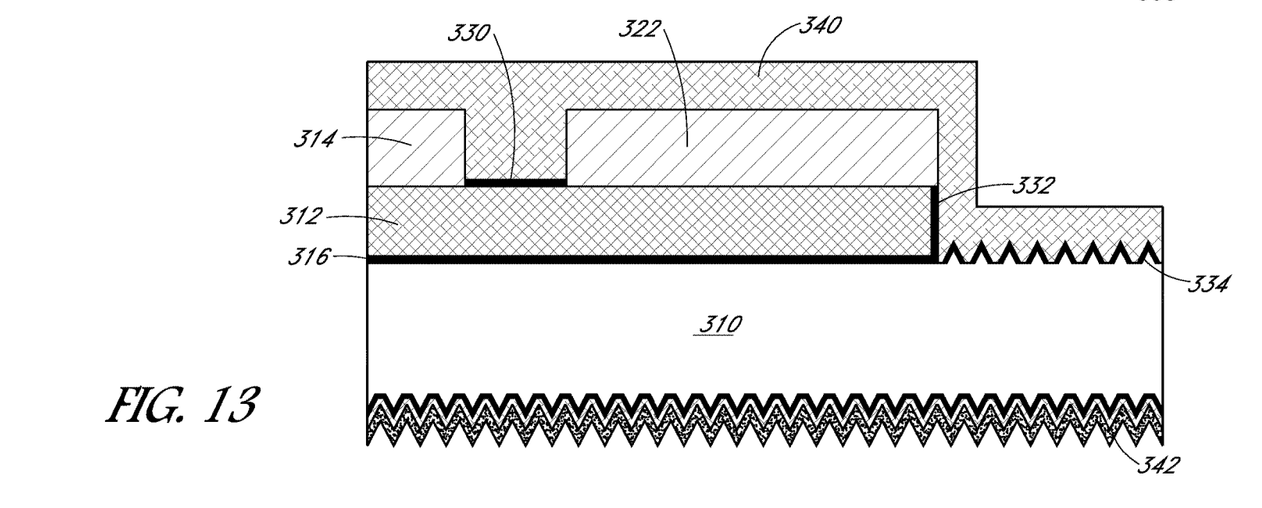

In some embodiments, a tunnel oxide layer and doped polysilicon (e.g., n-poly doped polysilicon) can be formed on the front surface as shown in FIG. 12. In various embodiments, the n-poly on both sides of the substrate can be annealed and nitride layer 342 can be deposited on the front surface as shown in FIG. 13.

Figure 14:
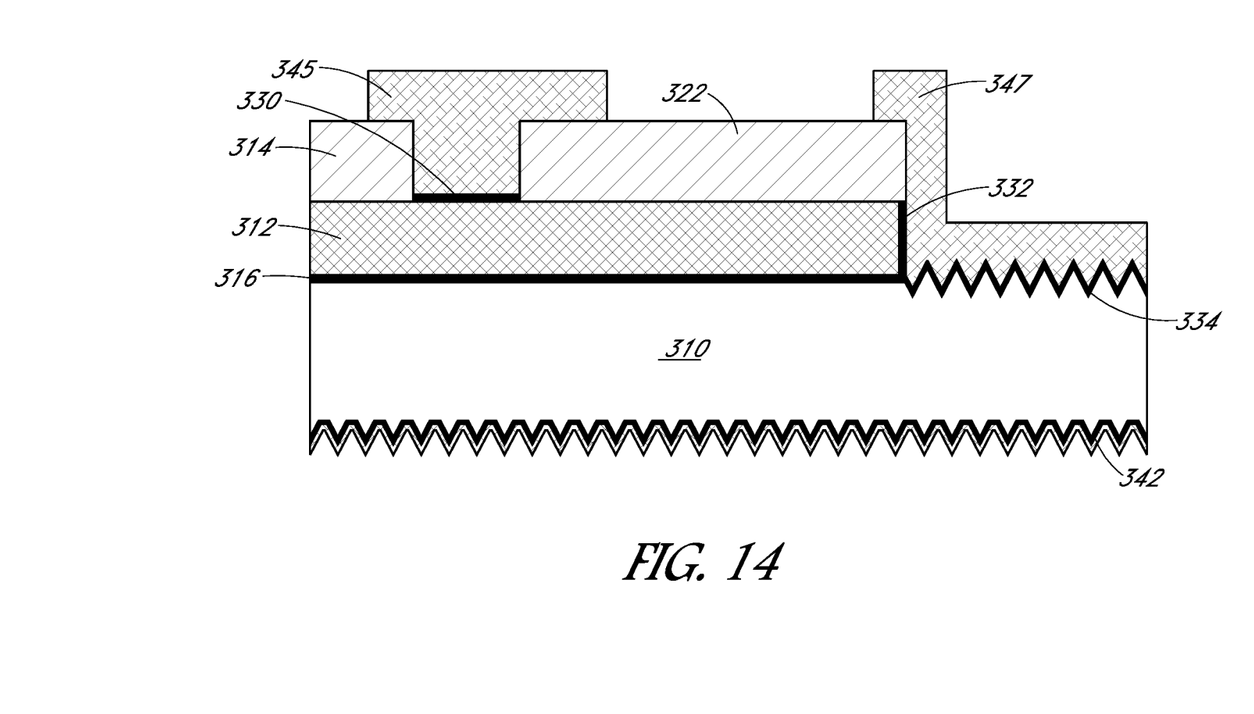

Referring again to FIG. 4, as illustrated at 410, a portion of the second conductive region can be removed to form, or isolate, first and second portions of the second conductive region. In one embodiment, the portion of the second conductive region (e.g., the region between portions 345 and 347 as shown in FIG. 14) can be removed by laser ablating that portion. Such laser ablation may be refer to as scribing and can include ablating the portion of the second conductive region without also ablating dielectric layer 322 under the second conductive region. In one embodiment, the scribing of the portion of the second conductive region can be performed by the same laser tool as other laser operations described herein but with the laser in a lower power setting (or different wavelength, shape, pulse duration, etc.). Or, the scribing can be performed with separate, lower power laser than is used for ablating multiple different layers at once.

At 412, metal of the second conductivity type can be coupled to the first conductive region and metal of the first conductivity type can be coupled to one of the portions (e.g., the first portion) of the second conductive region to form corresponding conductive connections. For example, in one embodiment, coupling metal of second conductivity type to the first conductive region can include coupling n-type metal to the p-type conductive region. And coupling metal of the first conductivity type can include coupling p-type metal to the one of the portions (e.g., first portion 345) of n-type conductive regions.

An example of the coupling of block 412 is illustrated in FIG. 3. Note that in some embodiments, the method can include removing a portion of dielectric layer 322. The result of such removal is illustrated in FIG. 3 by the region between dielectric layers 352 and 354. The region between dielectric layers 352 and 354 can permit second conductivity type metal 362 (e.g., n-type metal) to be coupled to the first conductive region (e.g., p-type conductive region). Also as shown in FIG. 3, first conductivity type metal 360 (e.g., p-type metal) can be coupled to first portion 345 of the second conductive region (e.g., n-type conductive region).

In one embodiment, third dielectric layer 330 can be made more conductive, for example by electrical stress (e.g., conductive a high current or applying a high bias, such as 10V, for a short period of time) or thermal stress (e.g., by anneal, by laser, etc.). By making the third dielectric layer more conductive, the area of the solar cell used by a bypass diode or diodes can be reduced thereby allowing the resulting solar cell to produce more power.

The disclosed structures and techniques can provide protection for reverse bias events and for temperature suppression of hot spots at the cell level, which in turn, can enable hot spot testing to be removed from the module processing flow. In addition, the disclosed structures and techniques can avoid shunting in manufacturing without requiring metallization over an isolation trench.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A solar cell, comprising:
    a substrate having a light-receiving surface and a back surface;
    a first thin dielectric layer disposed on the back surface of the substrate;
    a first conductive region of a first conductivity type disposed on the first thin dielectric layer;
    a second thin dielectric layer disposed on the back surface of the substrate;
    a first portion of a second conductive region of a second, different, conductivity type disposed on the second thin dielectric layer;
    a third thin dielectric layer in lateral contact with the first conductive region and in lateral contact with the first portion of the second conductive region, wherein the third thin dielectric layer laterally separates the first conductive region from the first portion of the second conductive region;
    a second portion of the second conductive region disposed on a fourth thin dielectric layer, wherein the second portion of the second conductive region is physically separate from the first portion of the second conductive region, wherein the fourth thin dielectric layer is directly vertically between the first conductive region and the second portion of the second conductive region, wherein the fourth thin dielectric layer is directly on an entirety of a bottommost surface of the second portion of the second conductive region, wherein an entirety of the fourth thin dielectric layer is within a footprint of the bottommost surface of the second portion of the second conductive region, and wherein the fourth thin dielectric layer spaces the bottommost surface of the second portion of the second conductive region apart from an uppermost surface of the first conductive region;
    a first conductive contact structure disposed on the second portion of the second conductive region, wherein the first conductive contact structure has an uppermost horizontal surface with respect to the back surface of the substrate, the uppermost horizontal surface of the first conductive contact structure vertically overlapping with and vertically spaced apart from the second portion of the second conductive region; and
    a second conductive contact structure disposed on the first conductive region and on the first portion of the second conductive region, wherein the second conductive contact structure has an uppermost horizontal surface with respect to the back surface of the substrate, the uppermost horizontal surface of the second conductive contact structure at a same level as the uppermost horizontal surface of the first conductive contact structure, the uppermost horizontal surface of the second conductive contact structure vertically overlapping with and vertically spaced apart from the first portion of the second conductive region.

2. The solar cell of claim 1, wherein first conductive region overlaps the first portion of the second conductive region.

3. The solar cell of claim 1, wherein the first and second conductive contact structures each comprise a metal selected from the group consisting of aluminum, copper and silver.

4. The solar cell of claim 1, wherein the substrate is an N-type monocrystalline silicon substrate, the first conductivity type is P-type, and the second conductivity type is N-type.

5. The solar cell of claim 1, wherein the first, second and third thin dielectric layers comprise a tunnel oxide.

6. The solar cell of claim 1, wherein the first conductive region of the first conductivity type comprises a P-type doped polysilicon.

7. The solar cell of claim 1, wherein the first portion and the second portion of the second conductive region of the second conductivity type comprise a N-type doped polysilicon.

8. A solar cell, comprising:
    a substrate having a light-receiving surface and a back surface;
    a first thin dielectric layer disposed on the back surface of the substrate;
    a first conductive region of a first conductivity type disposed on the first thin dielectric layer;
    a second thin dielectric layer disposed on the back surface of the substrate;
    a first portion of a second conductive region of a second, different, conductivity type disposed on the second thin dielectric layer;
    a third thin dielectric layer in lateral contact with the first conductive region and in lateral contact with the first portion of the second conductive region, wherein of the third thin dielectric layer laterally separates the first conductive region from the first portion of the second conductive region;
    a second portion of the second conductive region disposed on a fourth thin dielectric layer, wherein the second portion of the second conductive region is physically separate from the first portion of the second conductive region, wherein the fourth thin dielectric layer is directly vertically between the first conductive region and the second portion of the second conductive region, wherein the fourth thin dielectric layer is directly on an entirety of a bottommost surface of the second portion of the second conductive region, wherein an entirety of the fourth thin dielectric layer is within a footprint of the bottommost surface of the second portion of the second conductive region, and wherein the fourth thin dielectric layer spaces the bottommost surface of the second portion of the second conductive region apart from an uppermost surface of the first conductive region;

a dielectric region disposed on the first conductive region, wherein the second portion of the second conductive region is disposed through the dielectric region;

a first conductive contact structure disposed on the second portion of the second conductive region, wherein the first conductive contact structure has an uppermost horizontal surface with respect to the back surface of the substrate, the uppermost horizontal surface of the first conductive contact structure vertically overlapping with and vertically spaced apart from the second portion of the second conductive region; and a second conductive contact structure disposed on the first conductive region and on the first portion of the second conductive region, wherein a portion of the second conductive contact structure is disposed through the dielectric region, wherein the second conductive contact structure has an uppermost horizontal surface with respect to the back surface of the substrate, the uppermost horizontal surface of the second conductive contact structure at a same level as the uppermost horizontal surface of the first conductive contact structure, the uppermost horizontal surface of the second conductive contact structure vertically overlapping with and vertically spaced apart from the first portion of the second conductive region.

9. The solar cell of claim 8, wherein the first portion of the second conductive region overlaps the dielectric region.

10. The solar cell of claim 8, wherein the dielectric region comprises silicon dioxide.

11. The solar cell of claim 8, wherein the first and second conductive contact structures each comprise a metal selected from the group consisting of aluminum, copper and silver.

12. The solar cell of claim 8, wherein the substrate is an N-type monocrystalline silicon substrate, the first conductivity type is P-type, and the second conductivity type is N-type.

13. The solar cell of claim 8, wherein the first, second and third thin dielectric layers comprise a tunnel oxide.

14. The solar cell of claim 8, wherein the first conductive region of the first conductivity type comprises a P-type doped polysilicon.

15. The solar cell of claim 8, wherein the first portion and the second portion of the second conductive region of the second conductivity type comprise a N-type doped polysilicon.

* * * * *